United States Patent [19] [11] 4,091,141
Harris [45] May 23, 1978

[54] PHOTOCURABLE ELASTOMERIC POLYESTER COMPOSITION, FIBROUS ARTICLES IMPREGNATED THEREWITH AND METHOD OF MAKING SAME

[75] Inventor: Thomas G. Harris, Lancaster, Pa.

[73] Assignee: Armstrong Cork Company, Lancaster, Pa.

[21] Appl. No.: 791,834

[22] Filed: Apr. 28, 1977

[51] Int. Cl.² .............................................. B05D 3/06
[52] U.S. Cl. .................................... 428/290; 428/431; 428/443; 204/159.19; 260/75 T; 260/860; 427/54; 568/716
[58] Field of Search ............... 260/619 A, 51 R, 75 T, 260/860; 204/159.19; 427/54; 428/290, 431, 443

[56] References Cited
U.S. PATENT DOCUMENTS

| | | |
|---|---|---|
| 2,912,395 | 11/1959 | Graham .............................. 260/51 R |
| 3,444,130 | 5/1969 | Rosenbrock et al. ............. 260/75 T |
| 3,703,498 | 11/1972 | Harris ............................... 260/75 NK |
| 3,737,465 | 6/1973 | Karll et al. ....................... 260/619 A |
| 3,856,644 | 12/1974 | Traenckner et al. ............ 204/159.19 |

Primary Examiner—John H. Newsome

[57] ABSTRACT

An elastomeric polyester curable at room temperature by photoirradiation is disclosed. This composition comprises as a resin component:

(1) 15% to 50% by weight of an unsaturated polyester resin prepared by reacting tetrahydrophthalic anhydride or endic anhydride; optionally, an aromatic dicarboxylic acid or its equivalent; a diol having an allyl unsaturated group pendant from the diol chain; and optionally, an alkylene diol; and (2) 85% to 50% by weight of a methylolated phenolic crosslinking agent; and 0.5% to 5.0% by weight based on said resin component of a metal halide photoinitiator.

9 Claims, No Drawings

PHOTOCURABLE ELASTOMERIC POLYESTER COMPOSITION, FIBROUS ARTICLES IMPREGNATED THEREWITH AND METHOD OF MAKING SAME

BACKGROUND OF THE INVENTION

1. Field of the Invention

This invention relates to a novel photosensitive composition photopolymerizable by the action of actinic light. More particularly, this invention relates to photosensitive compositions comprising an unsaturated polyester possessing unsaturation in both the acid and alcohol portion, a methylolated phenolic crosslinking agent, and a metal halide photoinitiator. This invention further relates to gasketing and glass fiber impregnates utilizing this photosensitive composition.

2. Description of the Prior Art

It is recognized that polymeric coatings, impregnates and mold compositions, to receive wide acceptance, should respond readily to readily available crosslinking agents such as of the peroxide, sulfurvulcanizing or phenolic type. These compositions should not exhibit reversion tendencies at cure temperatures, and, when cured, should exhibit a suitable balance of properties such as elongation, compression set, heat stability, water resistance, oil, fuel and solvent resistance, and low temperature flexibility. Typically, the prior art impregnates, coatings and mold compositions are generally of an unsaturated nature and, in order to be cured, are subject to thermal treatment at relatively high temperatures, e.g. over 180° C., so as to establish a final crosslinked composition that is of acceptable physical properties. These compositions, while finding great commercial use, are energetically detrimental in view of the high temperatures necessary to initiate the curing. Further, substrates that are sensitive to thermal decomposition cannot be used with prior art compositions of this nature.

In order to obviate the problems of the high-temperature curing in the elastomeric polyesters, photoirradiation curing techniques have become popular. Namely, monomers, oligomers, and prepolymers possessing polymerizable unsaturation can advantageously be photopolymerized by the use of suitable photopolymerizable crosslinking agents and initiators. The crosslinking agents of particular use in the prior art are those polythiol materials having a wide range of molecular weight, such being active either in the presence of oxygen or under inert conditions, and utilizing photochemical initiators. For example, U.S. Pat. No. 3,908,039 discloses such thiol crosslinking system that is used in combination with a polyene resin component formed from a polybasic acid or anhydride and a polyhydric alcohol, such end capped with allylic or vinyl unsaturation. The photoinitiators described in this patent are a variety of the organic initiators such as benzophenone and the like. While the prior art thiol crosslinked polyester unsaturates provide cured compositions having acceptable properties, the cost of such system is relatively high, limiting their usefulness.

It is known that metallic salts are useful in thermally reactive resins such being further cured by the action by actinic light. Chrome-containing polyvinyl alcohols and polyvinyl alcohol cinnamate, for example, can be photocured in this manner to give a thin, photocrosslinked layer. The articles prepared by such photopolymerization, however, are known to suffer from insufficient hardness, strength and solvent resistance.

The prior art impregnates and coatings referred to above have found a variety of ultimate uses, mostly dependent on the final desired properties of the formed composites. The use of these crosslinkable compositions as impregnating agents for forming gasketing materials is widely recognized.

Gaskets are made by first preparing a slurry of asbestos or cellulose fiber in water. A charge, opposite to that of the crosslinkable impregnate composition (in the form of a latex) is placed on the fiber surface and the curing agents incorporated. The crosslinkable latex is then introduced and stirring continued until an aliquot shows clear liquor, that is, until the crosslinkable impregnate has been deposited on the fiber. The whole is then fed onto the Fourdrinier, drained, possibly calendered, and cured.

Recent government regulations pertaining to asbestos have led to attention being turned to glass papers being used to replace the asbestos-containing sheets, not only for gaskets but also for surface covering backings.

The formed mats are, however, low in breaking strength and poor in the MIT fold test. They also are extremely porous, having little air flow resistance.

SUMMARY OF THE INVENTION

An object of the present invention is to provide useful liquid photosensitive compositions, avoiding the prior art disadvantages.

A further object of the present invention is to provide photosensitive compositions that are room temperature cured.

A further object of the present invention is to provide a photopolymerizable composition that has excellent properties in the cured material, good flexibility, and high impact strength.

It is another object of the present invention to provide a photopolymerizable polyester composition that can be practiced easily and economically in commercial application.

It is a further object of the present invention to provide a photopolymerizable composition which, upon curing, can be used in room temperature vulcanizing gasketing materials or as a fibrous mat impregnate.

It is a further object of this invention to provide a photochemically curable polyester that can serve as a coating composition.

These and other objects of the present invention can be more completely appreciated, and the many advantages thereof will be readily attained, by reference to the following detailed description of the preferred embodiments.

DESCRIPTION OF THE PREFERRED EMBODIMENTS

It has been found that certain unsaturated polyesters, although containing no conjugated unsaturation, react readily with methylolated phenols at temperatures below 180° C., and that the reaction can be greatly accelerated by the inclusion of catalysts of the Lewis acid type. Surprisingly, the reaction also proceeds rapidly at room temperature upon exposure to ultraviolet light.

The preferable methylol phenols in this instance are derivatives of bisphenol containing from 1.5 to 1.9 methylol groups per phenolic unit:

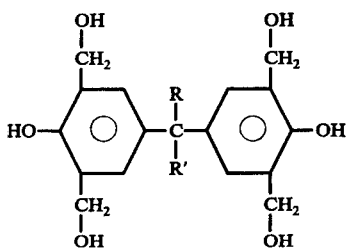

wherein R and R' can be the same or different and are hydrogen or $C_1$ to $C_4$ linear or branched alkyl such as $CH_3$, $-CH_2CH_3$, $-CH_2CH_2CH_3$, $-CH(-CH_3)CH_3$. The methylolated compounds of preference for use in these compositions are particularly set forth in U.S. Pat. No. 2,912,395, incorporated herein by reference.

Replacement of the methylolated phenols in the compositions of this invention by a more customary photochemical crosslinker such as pentaerythritol tetra(3-mercaptopropionate) disadvantageously yields an uncured film.

As a second ingredient in the resin component to be admixed with the above-disclosed methylolated phenol is used an unsaturated polyester comprising the condensation product of (a) from about 0 to 30 mol percent of a compound selected from the group consisting of

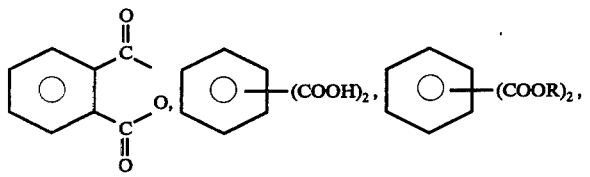

and mixtures thereof wherein R is an alkyl radical of 1 to 3 carbon atoms, (b) about 20 to 50 mol percent of a member selected from the group consisting of tetrahydrophthalic anhydride, endic anhydride and mixtures thereof, (a) plus (b) totaling about 50 mol percent of the total reactants, (c) about 1 to 10 mol percent of a diol having an allyl unsaturated group pendant from the diol chain, (d) a member selected from the group consisting of a polyoxyalkylene diol having an average number molecular weight in the range of about 400 to 4,000 and mixtures thereof, the mol percent range for said member being from about 20 to 40 when said diol has an average number molecular weight of about 400, the mol percent range at the higher average molecular weight being based on an equal weight substitution of the higher molecular weight polyoxyalkylene diol for a diol having a number average molecular weight of 400 in the 20 to 40 mol percent range, (e) an alkylene diol of the formula HO—R—OH, wherein R is an alkylene radical of 2 to 6 carbon atoms, said alkylene diol being present in an amount sufficient to bring the total mol percent of the diol reactants to about 50 mol percent of the total reactants where (c) plus (d) total less than 50 mol percent of the total reactants.

The above unsaturated polyester, bearing unsaturation in both the acid and alcohol portion of the repeating unit, is the condensation product of an aromatic dicarboxylic acid, anhydride, or ester, a member selected from the group consisting of tetrahydrophthalic anhydride, endic anhydride and mixtures thereof, a diol having an allyl unsaturated group pendant from the diol chain, a polyoxyalkylene glycol and an alkylene diol.

Examples of aromatic dicarboxylic acids used to prepare the unsaturated polyester in accordance with the present invention are isophthalic acid, terephthalic acid and phthalic anhydride. This reactant is preferably present in the polyester to the extent of 0 to 30 mol percent. Further, 20 to 50 mole percent of a member selected from the group consisting of tetrahydrophthalic anhydride, endic anhydride and mixtures thereof is utilized in the preparation of the polyester so as to form an unsaturated, aromatic carboxylate moiety in the polyester chain.

The diols having allyl unsaturated groups pendant from the diol chain useful in forming the polyester resins in accordance with the present invention are utilized to the extent of about 1 to 10 mol percent in the reactants forming the polyesters and are preferably of the general formula

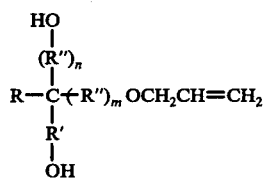

In the above formula, the hydroxyl groups may be primary or secondary; R may be hydrogen or an alkyl group of from 1 to 5 carbon atoms; R', R'' and R''' are alkylene groups of from 1 to 5 carbon atoms; $m$ is equal to 0 or 1 and $n$ is equal to 0 or 1. Examples of alkyl unsaturated diols useful herein are trimethylolpropane monoallylether and glyceryl monoallylether.

In addition, a member selected from the group consisting of polyoxyalkylene diol having an average molecular weight in the range of 400 to 4,000 and mixtures thereof are utilized in forming the polyester resin useful in the photocurable composition in accordance with the present invention. The mol percent range of the polyoxyalkylene diol reactant may vary from 20% to 40% when the diol has an average molecular weight of about 400, and the range varies proportionately at higher average molecular weights based on an equal weight substitution of the higher average molecular weight diol for the 400 molecular weight diol. Thus, where the diol has an average molecular weight of 4,000, the range would be 2 to 4 mol percent.

The diol reactants constitute about 50 mol percent of the reactants forming the polyester and, where the combined total of the diol having an allyl unsaturated group pendant from the diol chain and the polyalkylene glycol members constitute less than 50 mol percent, the balance necessary to give 50 mol percent of diol reactants in the reaction product is made up from an alkylene diol of the formular HO—R—OH wherein R stands for alkylene of 2 to 6 carbon atoms.

Preferably, the unsaturated polyester has a minimum number average molecular weight of about 2,500 and comprises (a) about 0 to 30 mol percent of phthalic anhydride, (b) about 20 to 50 mol percent of tetrahydrophthalic anhydride (a) plus (b) totaling 50 mol percent, (c) about 1 to 10 mol percent of trimethylol propane monoallylether, (d) about 20 to 40 mol percent by weight of a polyoxyethylene diol having a number average molecular weight of about 400, and (e) sufficient ethylene glycol to bring the total mol percent of diol reactants to about 50 mol percent where (c) plus (d) total less than 50 mol percent.

The above polyesters are more particularly set forth in my U.S. Pat. No. 3,703,498, filed Aug. 16, 1971.

In the compositions of the present invention, the ratio of unsaturated polyester resin to methylolated phenolic crosslinking agent is in the ratio of 15:85 to 50:50, preferably 25:75 to 40:60.

The metal halide photoinitiator of use in accordance with the present invention can be any metal halide that functions as a Lewis acid. The Lewis acid type catalysts are essential to this photochemical reaction. For example, their replacement by other prior art photoinitiators, such as benzoin isobutyl ether, results in an uncured film. Illustrative of the preferred metal halides are silver chloride, silver bromide, stannic chloride, stannous chloride, and titanium tetrachloride.

These photopolymerization initiators are preferably used in the range of 0.5% to 5% by weight based upon the total amount of photosensitive composition. When the amount of photopolymerizable initiator is less than 0.5% by weight, the photopolymerization reaction is greatly retarded and is disadvantageous from the practical point of view. On the other hand, when the amount of photoinitiator is greater than 5% by weight, the photosensitization is not fully intensified for this large amount and is, therefore, economically disadvantageous. Preferably, 0.5% to 3% by weight based upon total amount of photosensitive composition is useful in the composition in accordance with the present invention.

Known stabilizers may be employed for the purpose of maintaining a storage stability and a better resolubility of the photosensitive composition. Such stabilizers may be added when the components of the photosensitive composition are admixed or may be preliminarly added to each component prior to admixing the components.

Examples of the above-mentioned stabilizers include hydroquinone, p-tertiary butyl catechol, benzoquinone, pyridine, phenothiazine, naphthylamine, and nitrobenzene. These stabilizers are only added in order to prevent the dark reaction of the composition in accordance with the present invention without restraining the photopolymerization reaction. The amount of stabilizers of use herein is preferably from about 0.005% to 3% by weight of the total amount of photosensitive composition.

The compositions of the present invention are readily photopolymerizable in actinic light having wave lengths below 7,000 angstroms, generally between 2,000 and 5,000 angstroms. Such actinic light is generated from carbon arc lamps, superhigh-pressure mercury lamps, highpressure mercury lamps, low-pressure mercury lamps, UV fluorescent lamps, xenon lamps, and sunlight.

Photopolymerization of the compositions in accordance with the present invention is most successfully accomplished by exposing these compositions to actinic light at a distance of from about 5 centimeters to about 100 centimeters either in air or an inert atmosphere. The resulting compositions, e.g. the cured compositions, are especially useful for the manufacture of various printing inks, surface coating materials and molds for castings or molding ceramics or plastics. They are especially useful in the impregnation or coating of fiber webs such as formed of mineral (asbestos, glass, mineral wool, etc.) or organic (polyester, etc.) fiber, forming highly desirable elastomeric webs of superior physical characteristics. The polyester-phenolic compositions in accordance with the present invention can be easily introduced by a squeegee technique into various fibrous webs and, upon exposure to ultraviolet, yields a highly oil-resistant and heat-resistant gasket. The heat resistance improves as the amount of phenolic in the composition is increased.

The following elastomeric polyester having unsaturation in both the acid and alcohol portion of the polyester was prepared by the process disclosed in U.S. Pat. No. 3,703,498.

|  | Mols Initially |
|---|---|
| Phthalic anhydride | 10 |
| Tetrahydrophthalic anhydride | 40 |
| Trimethylol propane monoallyl ether | 2 |
| Polyoxyethylene glycol (of 400 mol wt.) | 30 |
| Ethylene glycol | 30.5 |
| Stannous octoate; 0.18% by wt. | — |

The above was condensed at 220° C., with water and ethylene glycol being removed, until an acid number of 0.7 and a hydroxyl number of 25.7 was reached.

The photocurable elastomeric compositions of the present invention are illustrated in the following examples. All data are expressed as parts by weight unless noted otherwise.

EXAMPLE 1-4

|  | 1* | 2* | 3 | 4* |
|---|---|---|---|---|
| Polyester (from above) | 93.5 | 84.5 | 84.5 | 84.5 |
| Pentaerythritol tetra(3-mercaptopropionate) | 5.0 | — | — | 12.5 |
| Benzoin isobutyl ether | 1.5 | 3.0 | — | — |
| Tetramethylol bisphenol A | — | 12.5 | 12.5 | — |
| Stannous chloride dihydrate | — | — | 3.0 | 3.0 |

*Comparative examples

The above were applied to an asbestos/nitrile rubber web (85:15) gasketing material using a 3-mill drawdown bar and exposed to a 1200-watt ultraviolet lamp for four minutes.

|  | 1* | 2* | 3 | 4* |
|---|---|---|---|---|
| Percentage of weight film | 8.4 | 7.3 | 8.1 | 6.9 |
| Condition of film | tacky | uncured | tack-free | uncured |
| Polyester/thio crosslink ratio | 18.7 | None | None | |

The above were applied to a glass web using a 3-mil drawdown bar and exposed to a 1200-watt utraviolet lamp for four minutes.

|  | 1* | 2* | 3 | 4* |
|---|---|---|---|---|
| Percentage of weight film | 81 | 81 | 80 | 84 |
| Condition of film | tacky | uncured | tack-free | uncured |
| Percentage gel in film | 9 | 0 | 29 | 0 |

Example 2 (comparative) demonstrates that the prior art photosensitizer benzoin isobutyl ether does not act as a photoinitiator when a methylolated phenol crosslinker is used. However, the compositions of this invention, illustrated by Example 3, show that stannous chloride dihydrate does serve as a photoinitiator when a methylolated phenol crosslinker is used.

The elastomeric polyester of the following composition is employed in Examples 5 through 11.

|  | mols |
| --- | --- |
| Tetrahydrophthalic anhydride | 50 |
| Trimethylol propane monoalkyl ether | 2 |
| Polyoxyethylene glycol (of 400 mol. wt.) | 30 |
| Ethylene glycol | 30.5 |
| Stannous octoate 0.18% by wt. | — |

The condensation was carried out to an acid number of 0.5 and a hydroxyl number of 24.5.

The following compositions (parts by weight) were prepared, using the above polyester:

|  | 5 | 6 | 7 | 8 |
| --- | --- | --- | --- | --- |
| Acetone | 200 | 200 | 200 | 200 |
| Polyester (above) | 85 | 70 | 45 | 20 |
| Tetramethylol bisphenol A | 15 | 30 | 55 | 80 |
| Stannous chloride dihydrate | 3 | 3 | 3 | 3 |

EXAMPLES 5-8

The compositions of Examples 5-8 were applied by a squeegee roll to a 5 inches × 8 inches square glass web, the acetone allowed to evaporate, and the composition cured by exposure to ultraviolet light (200 watt lamp, 400 volt setting, four minute exposure, seven inches from sample).

Physical properties are as follows:

|  | Untreated Glass Web | 5 | 6 | 7 | 8 |
| --- | --- | --- | --- | --- | --- |
| Percentage of wt. film | — | 76.7 | 76.1 | 71.8 | 71.3 |
| Percentage gel in film | — | 89 | 93 | 98 | 100 |
| Thickness (mils) | 22 | 25 | 26 | 27 | 26 |
| Breaking strength (lbs. pull 1" width) | 5.7 | 18.1 | 49.7 | 62.8 | 63.5 |
| Elongation (%) | 2.5 | 4.0 | 3.8 | 2.9 | 2.5 |
| MIT Fold Test (no double folds) | 2095 | 2464 | 384 | 2 | 2 |
| Elmensdorf Tear Test (gms) ASTM D-689-62 | 139 | 139 | 224 | 128[1] | 85[1] |

[1]Sample tore to side

Breaking strength increases as the polyester:methylolated phenolic crosslinking agent ratio decreases. When the ratio reaches 45/55, however, fold and tear test results become unsatisfactory.

EXAMPLE 9

Composition identical to Example 6, but replacing the stannous chloride dihydrate by an equal weight of stanneous octoate. This composition shows no tendency to cure under the ultraviolet conditions previously recorded.

EXAMPLES 10, 11

Compositions identical to Example 6, but reducing the stannous chloride dihydrate content.

|  | 6 | 10 | 11 |
| --- | --- | --- | --- |
| Parts stannous chloride dihydrate | 3.0 cures | 1.0 cures | 0.5 cures (marginal) |

|  | 6 | 10 | 11 |
| --- | --- | --- | --- |
| Percent gel in film | 93 | 95 | 72 |

The following polyester elastomeric compositions were employed in place of the polyester of illustrative Example 6, e.g. using 3 parts by weight stannous chloride dihydrate.

EXAMPLES 12-14

|  | starting mols | | |
| --- | --- | --- | --- |
|  | 12 | 13 | 14 |
| Phthalic anhydride | 10 | 10 | 10 |
| Tetrahydro phthalic anhydride | 40 | 40 | 40 |
| Trimethylol propane mono allyl ether | 1 | 2 | 1 |
| Polyoxyethylene glycol (400 mol wt.) | 30 | 35 | 35 |
| Ethylene glycol | 31.5 | 25.5 | 26.5 |
| Stannous octoate (0.18% by wt.) | — | — | — |
| Acid number | 0.65 | 0.65 | 0.81 |
| Hydroxyl number | 23.9 | 24.4 | 24.9 |
| Percentage of wt. film | 75.6 | 75.3 | 76.0 |
| Percentage gel in film | 97 | 96 | 94 |
| Thickness (mils) | 25 | 25 | 27 |
| Breaking strength | 55.5 | 48.5 | 49.3 |
| Elongation | 3.5 | 3.4 | 3.5 |
| MIT Fold Test | 352 | 458 | 712 |
| Elmensdorf Tear Test | 235 | 240 | 219 |

EXAMPLES 15, 16

The composition of Example 12, but reducing the stannous chloride dihydrate content.

|  | 12 | 15 | 16 |
| --- | --- | --- | --- |
| Parts stannous chloride dihydrate | 3.0 | 1.0 | 0.5 |
|  | cures | cures | no cure |
|  | 97 | 93 | — |

What is claimed is:

1. A photopolymerizable composition curable at room temperature by photoirradiation comprising a resin component of:
   (1) 15% to 50% by weight of an unsaturated polyester resin comprising the reaction product of tetrahydrophthalic anhydride endic anhydride or an aromatic dicarboxylic acid and, a diol having an allyl unsaturated group pendant from the diol chain;
   (2) 85% to 50% by weight of a methylolated phenolic cross-linking agent; and, 0.5% to 5.0% by weight based on said resin component of a metal halide, Lewis acid photoinitiator.
2. The composition of claim 1 wherein said unsaturated polyester resin has a molecular weight of about 2,500 and comprises the reaction product of
   (a) about 0 to 30 mol percent of phthalic anhydride, (b) about 20 to 50 mol percent of tetrahydrophthalic anhydride (a) plus (b) totalling 50 mol percent,
(c) about 1 to 10 mol percent of trimethylol propane monoallylether,
(d) about 20 to 40 mol percent by weight of a polyoxyethylene diol having a number average molecular weight of about 400, and
(e) a sufficient amount of an alkylene diol to bring the total mol percent of diol reactants to about 50 mol percent where (c) plus (d) total less than 50 mol percent.

3. The composition of claim 2 wherein said methylolated phenolic crosslinking agent comprises a compound of the formula

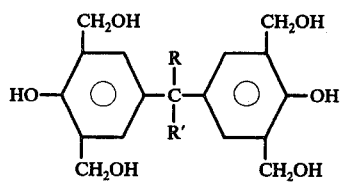

wherein R and R' can be the same or different and are hydrogen or $C_1$ to $C_4$ linear or branched alkyl.

4. The composition of claim 3 wherein R and R' are the same and are methyl.

5. A photopolymerizable composition curable at room temperature by photoirradiation comprising
(1) 15% to 30% by weight of an unsaturated polyester resin having a minimum number average molecular weight of about 2,500 comprising the condensation product of
(a) about 0 to 30 mol percent of phthalic anhydride,
(b) about 20 to 50 mol percent of tetrahydrophthalic anhydride (a) plus (b) totalling 50 mol percent,
(c) about 1 to 10 mol percent of trimethylol propane monoallylether,
(d) about 20 to 40 mol percent by weight of a polyoxyethylene diol having a number average molecular weight of about 400, and
(e) sufficient ethylene glycol to bring the total mol percent of diol reactants to about 50 mol percent where (c) plus (d) total less than 50 mol percent,
(2) 85% to 50% by weight of a methylolated phenolic crosslinking agent of the formula

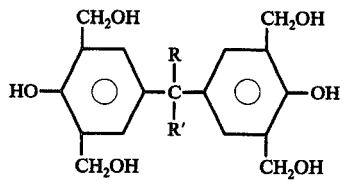

wherein R and R' can be the same or different and are hydrogen or $C_1$ to $C_4$ linear or branched alkyl; and 0.5% to 5.0% by weight based on said resin component of a metal halide photoinitiator comprising silver chloride, silver bromide, stannic chloride, stannous chloride or titanium tetrachloride.

6. A method for coating a fibrous web comprising the steps of
(a) contacting the fibrous web with a photopolymerizable composition curable at room temperature by photoirradiation comprising
(1) 15% to 30% by weight of an unsaturated polyester resin having a minimum number average molecular weight of about 2,500 comprising the condensation product of
(a) about 0 to 30 mol percent of phthalic anhydride,
(b) about 20 to 50 mol percent of tetrahydrophthalic anhydride (a) plus (b) totalling 50 mol percent,
(c) about 1 to 10 mol percent of trimethylol propane monoallylether,
(d) about 20 to 50 mol percent by weight of a polyoxyethylene diol having a number average molecular weight of about 400, and
(e) sufficient ethylene glycol to bring the total mol percent of diol reactants to about 50 mol percent where (c) plus (d) total less than 50 mol percent,
(2) 85% to 50% by weight of a methylolated phenolic crosslinking agent of the formula

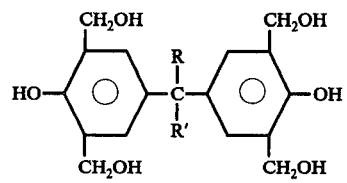

wherein R and R' can be the same or different and are hydrogen or $C_1$ to $C_4$ linear or branched alkyl; and 0.5% to 5.0% by weight based on said resin component of a metal halide photoinitiator comprising silver chloride, silver bromide, stannic chloride, stannous chloride or titanium tetrachloride,
(b) irradiating the fibrous web of step (a) with actinic light having a wave length below 7,000 angstroms for a time sufficient to photopolymerize said photopolymerizable composition.

7. A gasket formed by the method of claim 6.

8. The gasket of claim 7 wherein said fibrous web is formed of glass fibers of diameter 1 to 20 microns.

9. The gasket of claim 7 wherein said fibrous web is formed of asbestos/nitrile rubber.

* * * * *